(12) United States Patent
Richardson

(10) Patent No.: US 7,170,727 B2
(45) Date of Patent: Jan. 30, 2007

(54) LOW CAPACITANCE DIFFERENTIAL INPUT PAD WITH COMMON MODE REJECTION, SELECTABLE INPUT IMPEDANCE, AND ESD PROTECTION

(75) Inventor: Kenneth Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 401 days.

(21) Appl. No.: 10/357,044

(22) Filed: Jan. 31, 2003

(65) Prior Publication Data
US 2004/0161276 A1    Aug. 19, 2004

(51) Int. Cl.
*H02H 3/22* (2006.01)
(52) U.S. Cl. .......................... 361/56; 361/111
(58) Field of Classification Search ................ 361/56, 361/57, 58, 91.1, 110, 111
See application file for complete search history.

(56) References Cited

U.S. PATENT DOCUMENTS

| | | | | |
|---|---|---|---|---|
| 4,158,863 A | * | 6/1979 | Naylor | 361/56 |
| 6,643,540 B2 | * | 11/2003 | Yonce | 600/509 |
| 6,734,702 B1 | * | 5/2004 | Ikeoku et al. | 326/30 |

* cited by examiner

*Primary Examiner*—Brian Sircus
*Assistant Examiner*—Danny Nguyen
(74) *Attorney, Agent, or Firm*—Cochran Freund & Young LLC

(57) ABSTRACT

An input pad for a differential current input to an integrated circuit contains a switchable and tunable input impedance. The input pad also contains ESD protection and common mode rejection while maintaining low capacitance. The common mode rejection comprises two resistors that combine to remove the common mode current from the two input lines, produce a reference current, and drive two output transistors that cancel the common mode current from the outputs.

4 Claims, 3 Drawing Sheets

LOW CAPACITANCE DIFFERENTIAL INPUT PAD WITH COMMON MODE REJECTION, SELECTABLE INPUT IMPEDANCE, AND ESD PROTECTION

BACKGROUND OF THE INVENTION a. Field of the Invention

The present invention pertains to integrated circuits and specifically to input pads used on integrated circuit dies.

b. Description of the Background

Standardized circuitry blocks are commonly used in today's very large scale integrated (VLSI) circuits. The circuitry blocks may have a specific functionality and may be combined with other blocks to create specialized integrated circuits for many types of applications. Examples of standardized circuitry includes memory modules, processor modules, and input/output (I/O) pads.

I/O pad is a term used to define the bonding surface of an integrated circuit die. In many cases, an I/O pad may include some passive or active circuitry for various functions. The standardized I/O pads may include various functions through which an incoming or outgoing electrical signal may be conditioned or changed prior to entering or exiting the integrated circuit die. The I/O circuitry may reside underneath the actual bonding surface on the top layer of the integrated circuit.

Many different circuits are commonly used in I/O pads. For example, such circuits may provide ESD protection, filter an incoming signal, or provide matching impedance for connecting circuitry. If the functions were not provided in the I/O circuitry, the same functionality would have to be provided somewhere else in the integrated circuit.

As manufacturing techniques improve for integrated circuits, more circuitry can be placed in a specific area. For example, the amount of circuitry that may be placed beneath the bonding surface of an I/O pad is increasing as manufacturing techniques improve. Further, the need for many functions for signal preparation of incoming signals is likewise increasing.

It would therefore be advantageous to provide an I/O pad that comprises ESD protection and adjustable impedance. It would be further advantageous if the I/O pad were suited for a differential input, provided a minimum of capacitance, and provided common mode rejection.

SUMMARY OF THE INVENTION

The present invention overcomes the disadvantages and limitations of the prior art by providing a system and method for conditioning a differential input signal pair by providing ESD protection, common mode rejection, and switchable input impedance. The ESD protection may be accomplished with several diodes attached to the input lines. The common mode rejection may be accomplished by connecting the input signals through two resistors and driving a reference transistor that in turn drives two output transistors that remove any common mode signal from the outputs. The input impedance may have resistors that are switched in and out to change the input impedance.

The present invention may therefore comprise an input pad for differential current signals on an integrated circuit comprising: a first input; a second input; an upper reference voltage; a lower reference voltage; a first primary ESD protection circuit connected to said first input; a second primary ESD protection circuit connected to said second input; a first amplifier connected to said first ESD protection circuit and having an output; a second amplifier connected to said second ESD protection circuit and having an output; a common mode rejection circuit connected between said first ESD protection circuit and said first amplifier and said second ESD protection circuit and said second amplifier, said common mode rejection circuit further having a first output and a second output; a first output connected to said first output of said common mode rejection circuit and said output of said first amplifier; and a second output connected to said second output of said common mode rejection circuit and said output of said second transistor.

The advantages of the present invention are that a standard library input pad may be used for many applications for differential current signals. The input pad may provide ESD protection for an integrated circuit as well as conditioning the signals for further processing. In addition, the pad may be used in applications where different input impedances are required.

DETAILED DESCRIPTION OF THE INVENTION

Figure 1:
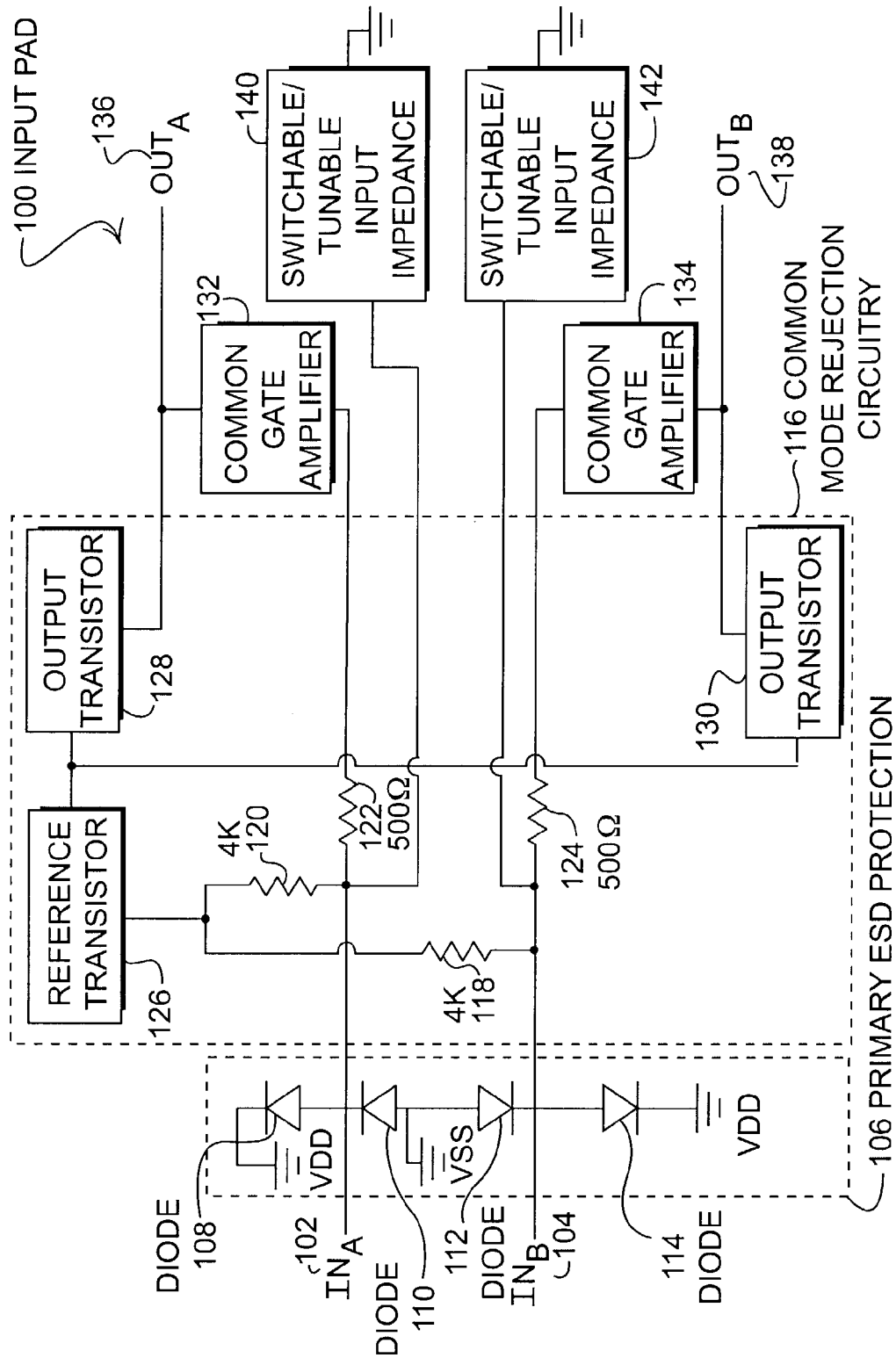
FIG. 1 is an illustration of an embodiment of the present invention of an input pad for an integrated circuit.

FIG. 1 illustrates an embodiment 100 of the present invention of an input pad for an integrated circuit. The embodiment 100 is a differential input that has ESD protection 106, common mode rejection circuitry 116, and switchable input impedance 140 and 142.

The embodiment 100 may be connected directly to the bonding pad through which signals are transmitted onto an integrated circuit. The embodiment 100 may be a standard circuit that is used for conditioning differential input signals for an integrated circuit. Such circuits may be part of a library of standardized circuits that are used in designing very large scale integrated (VLSI) circuit chips. It is common to create libraries of blocks of circuitry such as input pads that may be used for many different applications.

The primary ESD protection circuitry 106 comprises diodes 108 and 110 that connect the first input 102 to a high potential and low potential, respectively. Similarly, diodes 114 and 112 connect to a high potential and low potential, respectively. If the input voltage is above the breakdown voltage of the diodes, the current will be shunted to the power supply and the downstream circuitry will not see a high potential. The primary ESD circuitry thereby serves to protect the input pad and downstream circuitry from transient voltage spikes. The common mode rejection circuitry 116 comprises two resistors 118 and 120 that are a multiple of the resistance of resistors 122 and 124. The resistors 122 and 124 are located in series with the signal path. The resistors 118 and 120 are coupled together and serve to draw off the common mode signal from the input lines 102 and 104. The resistors 118 and 120 feed the reference transistor 126 that controls the output transistors 128 and 130. The output transistors adjust the output signals 136 and 138 to compensate for the common mode signal. The ratio of the resistance of resistors 118 and 122 is related to the ratio of amplification of the output transistors 126 and 128 and the gate amplifiers 132 and 134. The net effect is that the signals that are common to both input lines 102 and 104 are removed from the output signals 136 and 138 by the output transistors 128 and 130.

The switchable/tunable input impedance circuits 140 and 142 allow the input impedance to be switched from one nominal value to another. For example, some input signals may require 75 ohms of input impedance. Other signals may require 50 ohms of input impedance. In general, the input impedance requirements of a signal may be constant. However, the switchable input impedance allows the same block of circuitry for the input pad to be used with different input signals. This allows the same library circuit for an input pad to be used repeatedly without having to maintain separate library circuits for different input impedances.

Figure 2:
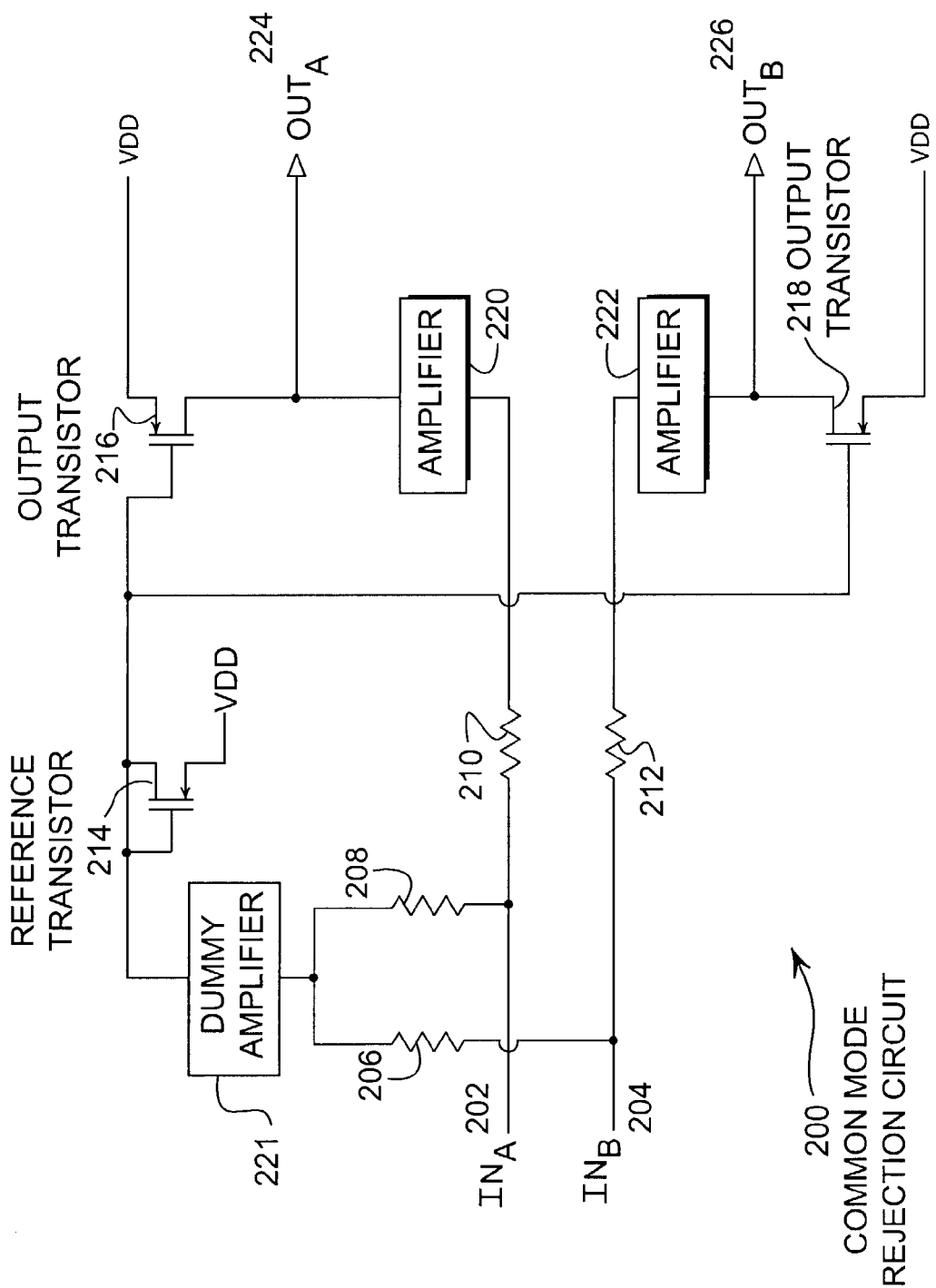
FIG. 2 is an illustration of an embodiment of the present invention of a common mode rejection circuit.

FIG. 2 illustrates an embodiment 200 of a common mode rejection circuit. The input lines 202 and 204 are connected to resistors 206 and 208 that are tied together and connected to a dummy amplifier 221. The input lines 202 and 204 are also connected to resistors 210 and 212 in series with amplifiers 220 and 222. The reference transistor 214 is connected to the dummy amplifier 221 through the gate and source. The drain of reference transistor 214 is connected to the lower reference voltage VDD. The reference transistor 214 drives output transistors 216 and 218 through the gates. The drains of output transistors 216 and 218 are connected to the lower reference voltage and the sources are connected to the output lines 224 and 226.

The reference transistor 214 and output transistors 216 and 218 operate as a current mirror with two outputs. In essence, any signal that is common to both input lines 202 and 204 is amplified through the current mirror and applied to both output lines 224 and 226 simultaneously, thereby canceling the effects of the common mode signal.

As will be appreciated by those skilled in the arts, the ratio of the resistance between resistor 206 and 210 must be matched to the ratio of amplification of the dummy amplifier 221 and the amplifier 220. When properly balanced, the input lines 202 and 204 may be amplified a desired amount as output signals 224 and 226 while removing unwanted common mode signals. In some embodiments, the overall amplification of the signals may be unity. In such embodiments, the differential output signals have an improved differential to common mode signal ratio. Further, the various transistors in the input pad circuitry, such as reference transistor 214 and the amplifiers 220 and 222 provide secondary ESD protection.

Figure 3:
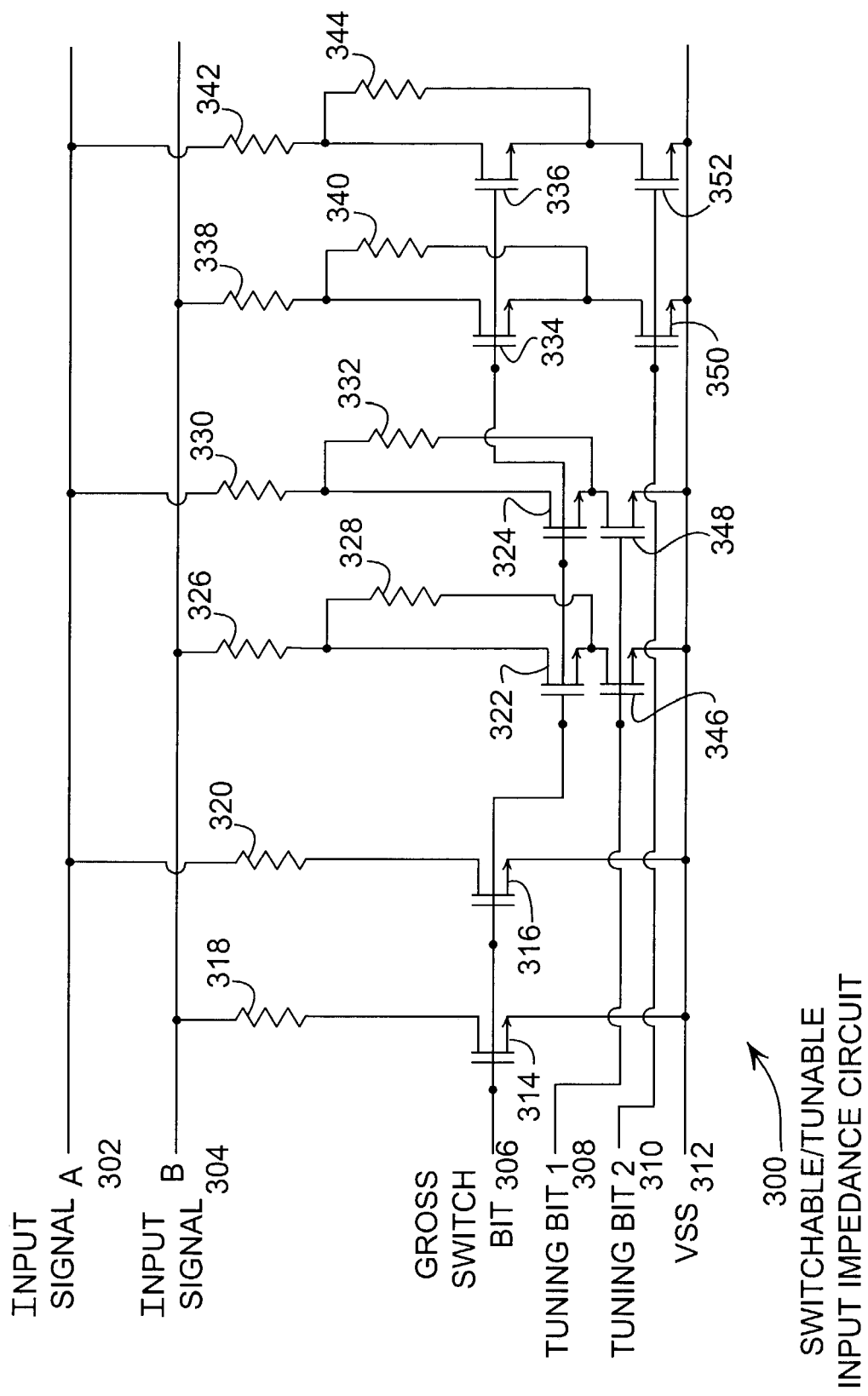
FIG. 3 is an illustration of an embodiment of the present invention of a switchable and tunable input impedance circuit.

FIG. 3 illustrates an embodiment 300 of a switchable and tunable input impedance circuit. Input lines 302 and 304 can have variable impedance set by a gross switch bit 306 and tuning bits 308 and 310. VSS 312 is the lower reference voltage.

Gross switch bit 306 controls transistors 314 and 316 that can switch resistors 318 and 320 between the input lines 302 and 304 and VSS 312. Gross switch bit 306 also controls transistors 322, 324, 334, and 336 that switch resistors 328, 332, 340, and 344 into series with tuning resistors 326, 330, 338, and 342, respectively. When the gross switch bit 306 is high, the resistors 318 and 320 add impedance to the input lines 302 and 304. In this manner, the impedance may be switched from 50 to 75 ohms. Similarly, when gross switch bit 306 is high, the effective resistance of the tuning resistors 326, 330, 338, and 342 are switched into a range that may be more desirable for fine tuning within the second range of input impedance.

The tuning bits 308 and 310 operate in the same manner as gross switch bit 306 to switch in and out various resistors that change the impedance of the input lines 302 and 304. Tuning bit 308 operates transistors 346 and 348 that switch the resistors 326 and 330 into the circuit, respectively. Similarly, tuning bit 310 operates transistors 350 and 352 that switch resistors 338 and 342 into the circuit, respectively.

The resistors switched by the gross switch bit 306 may be relatively large resistor values to change the range of impedance from a high range to a low range. The resistors switched by the tuning bits 308 and 310 may be relatively low values and may be used to compensate for slight adjustments of the input impedance to maximize performance. Those skilled in the arts will appreciate that various values of resistance may be used with the present embodiment while keeping within the sprit and intent of the present invention.

Different numbers of switchable resistors may be used while keeping within the spirit and intent of the present invention. An embodiment may include only one pair of resistors that are switched into the circuit. Another embodiment may include 3 sets of resistors designed to switch between three different input impedances. Further embodiments may include many sets of resistors for fine tuning the input impedances.

Secondary ESD protection is provided by resistances 318, 320, 326, 330, 338, and 342 as well as resistances 118, 120, 122, and 124 shown in FIG. 1. It will be appreciated by those skilled in the art that correct physical and electrical sizing of these resistances will provide additional secondary protection of the down stream circuitry. This is especially true when the downstream connection is to the drain of a MOSFET of proper size when used either as a switch, as shown in FIG. 3 or when providing biasing current to the source of the common gate amplifiers in FIGS. 1 and 2. The biasing devices in these figures are omitted for clarity.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An input pad for differential current signals on an integrated circuit comprising:
    a first input;
    a second input;
    an upper reference voltage set to an upper fixed voltage value;
    a lower reference voltage set to a lower fixed voltage value;
    a first primary ESD protection circuit connected to said first input and also connected to said upper reference voltage and to said lower reference voltage;
    a second primary ESD protection circuit connected to said second input and also connected to said upper reference voltage and to said lower reference voltage;
    a first amplifier having a first connection to said first ESD protection circuit and having an output;

a second amplifier having a second connection to said second ESD protection circuit and having an output;

a common mode rejection circuit that is connected to said first connection between said first ESD protection circuit and said first amplifier and said second connection between said second ESD protection circuit and said second amplifier, said common mode rejection circuit further having a first output and a second output, and said first ESD protection circuit and said second ESD protection circuit not included as part of said common mode rejection circuit;

a first output connected to said first output of said common mode rejection circuit and said output of said first amplifier, said output of said first amplifier not coupled to said first output through said common mode rejection circuit, and said first output not connected to said first ESD protection circuit; and a second output connected to said second output of said common mode rejection circuit and said output of said second amplifier, said output of said second amplifier not coupled to said second output through said common mode rejection circuit, and said second output not connected to said second ESD protection circuit.

2. The input pad of claim 1 wherein:

said first ESD protection circuit comprises at least one diode connected to said first input and said upper voltage and at least one diode connected to said lower reference voltage and said first input; and said second ESD protection circuit comprises at least one diode connected to said second input and said upper voltage and at least one diode connected to said lower reference voltage and said second input.

3. The input pad of claim 1 wherein said common mode rejection circuit further comprises:

a first input resistor connected in series between said first primary ESD protection circuit and said first amplifier;

a second input resistor connected in series between said second primary ESD protection circuit and said second amplifier, said second input resistor being the same resistance as said first input resistor;

a first regulating resistor connected to said first input between said ESD protection circuit and said first input resistor, said first regulating resistor having a larger resistance than said first input resistor by a predetermined ratio;

a second regulating resistor connected to said second input between said ESD protection circuit and said second input resistor, said second regulating resistor having the same resistance as said first regulating resistor;

a set of reference transistors connected in parallel having the gates connected to said first regulating resistor and said second regulating resistor, the drains connected to the gates, and the sources connected to said lower reference voltage, said set of reference transistors comprising at least one transistor;

a set of first common mode output transistors connected in parallel having the gates connected to said gates of said set of reference transistors, the sources connected to said upper reference voltage, and drains connected to said first output of said common mode rejection circuit, said set of first common mode output transistors having at least one transistor; and a set of second common mode output transistors connected in parallel having the gates connected to said gates of said set of reference transistors, the sources connected to said upper reference voltage, and drains connected to said first output of said common mode rejection circuit, said set of second common mode output transistors having at least one transistor.

4. The input pad of claim 1 further comprising:

a first switchable input impedance circuit comprising a first input impedance resistor connected to said first ESD protection circuit and a first switch, said first switch being connected to said lower voltage source; and a second switchable input impedance circuit comprising a second input impedance resistor connected to said second ESD protection circuit and a second switch, said second switch being connected to said lower voltage source.

* * * * *